United States Patent [19]

Levine et al.

[11] 4,216,258
[45] Aug. 5, 1980

[54] MECHANICALLY FORMABLE COMPOSITE PART

[75] Inventors: Simon Levine, Antony; Alain Nakach, Gometz-la-Ville par Orsay, both of France

[73] Assignee: Commissariat a l'Energie Atomique, Paris, France

[21] Appl. No.: 956,894

[22] Filed: Nov. 2, 1978

[30] Foreign Application Priority Data

Nov. 4, 1977 [FR] France .................. 77 33222

[51] Int. Cl.² .................. B32B 3/10; B32B 15/04; B32B 15/08; G03C 5/00
[52] U.S. Cl. .................. 428/209; 339/17 R; 428/901; 430/319
[58] Field of Search ............. 428/209, 901; 339/17 R; 96/36.2

[56] References Cited

U.S. PATENT DOCUMENTS 3,427,715  2/1969  Mika .................. 339/17 R X

FOREIGN PATENT DOCUMENTS 1143248  2/1963  Fed. Rep. of Germany .

Primary Examiner—Thomas J. Herbert, Jr.
Attorney, Agent, or Firm—Thomas R. Boland

[57] ABSTRACT

The composite part is constituted by a plate of flexible material such as plastic which has electrical and/or thermal insulating properties, at least one face of the plate being provided with a metal cladding which is subjected to a photoetching process in order to form raised metallic portions corresponding to a printed circuit pattern, for example. Permanent deformation of the raised metallic portions can be produced by means of a mechanical cold-forming process without exceeding the range of elastic deformation of the flexible plate.

5 Claims, 2 Drawing Figures

MECHANICALLY FORMABLE COMPOSITE PART

This invention relates to a mechanically formable composite part which is primarily intended to be used in the fabrication of printed circuits in the form of curved plates.

In more exact terms, the invention is concerned with a composite part of the type comprising a plate of flexible material providing electrical and/or thermal insulation, at least one face of which is partly covered with metal so as to form raised metallic portions on said plate.

Parts of this type which are known at the present time are usually in the form of rigid or flexible plates having metallic portions of relatively small thickness of the order of 0.1 mm. A disadvantage consequently arises from the fact that such parts are not capable of withstanding high current densities and cannot be employed in a particular configuration such as a printed circuit of cylindrical shape, for example, unless they are flexible and associated with suitable supporting means for maintaining them in the desired shape.

The precise aim of the present invention is to provide a composite part which overcomes the above-mentioned disadvantages since this part is capable of withstanding high current densities, can readily be converted to a part having a special shape by cold-forming and can consequently be employed in the fabrication of printed circuits which have a given configuration and do not call for the use of special supporting means.

In accordance with the invention, the composite part which can be given a predetermined shape by means of a mechanical forming process comprises a plate of flexible material providing electrical and/or thermal insulation and partly covered with metal on at least one face so as to form raised metallic portions on said plate. The composite part is distinguished by the fact that the thickness respectively of said plate and said metallic portions is such that said part can be given the desired shape by mechanical forming so as to produce permanent deformation of said metallic portions without exceeding the range of elastic deformation of said plate.

The composite part as defined in the foregoing takes advantage of the fact that a judicious choice of respective thicknesses of the plate and of the metallic portions permit mechanical forming of the covered plate in the cold state so as to obtain a rigid part having a given shape by producing a permanent deformation of said metallic portions at the time of mechanical forming operation without exceeding the range of elastic deformation of said plate.

In accordance with the invention, the thickness of said plate is preferably equal at a maximum to the thickness of said metallic portions and these latter preferably have a thickness at least equal to 0.3 mm.

In accordance with an advantageous feature of the invention, said plate is of plastic material such as, for example, epoxy resin reinforced with glass fibers, polyimide or polyimide reinforced with glass fibers.

In accordance with a further distinctive feature of the invention, the metallic portions are advantageously formed of metal selected from the group comprising copper, silver and aluminum, and preferably of copper.

A more complete understanding of the invention will be obtained from the following description which is given by way of illustrative example and not in any limiting sense, reference being made to the accompanying drawings, wherein.

Figure 1:
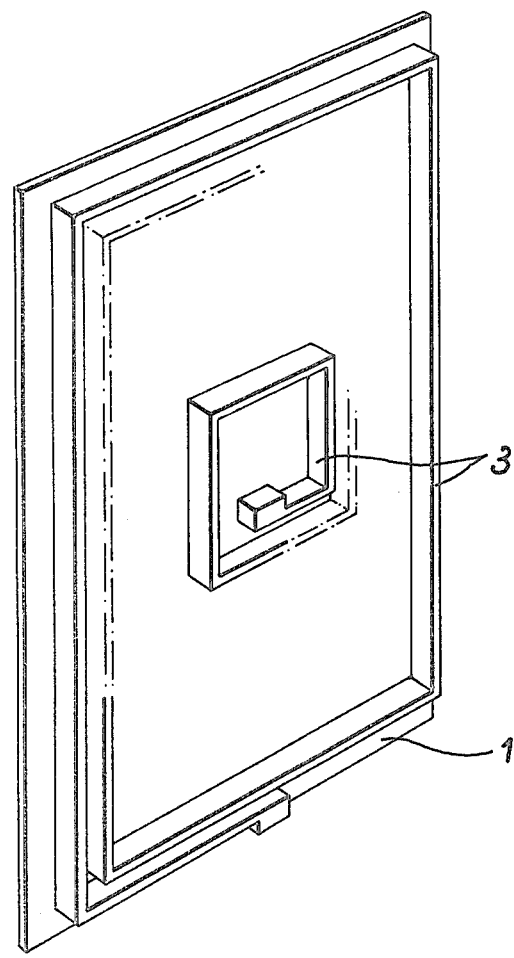
FIG. 1 is a diagrammatic illustration of a composite part in accordance with the invention.

Referring first to FIG. 1, it is apparent that the composite part is constituted by a plate 1 of flexible material which provides electrical and/or thermal insulation and is constituted for example by epoxy resin reinforced with glass fibers having a thickness of approximately 0.3 mm.

The plate 1 is provided on each face, only one of which is shown in the drawing, with raised metallic portions 3 having a thickness of approximately 0.6 mm and formed of copper, said portions being placed on the substrate in accordance with a predetermined outline which corresponds for example to a magnetic circuit pattern.

One of the main advantages of this part is that it can be formed mechanically in the cold state. In fact, the respective thicknesses of the plate and of the metallic portions of copper are such as to make it possible to obtain from this part a curved plate having a minimum radius of curvature of the order of 50 mm by mechanical forming. This is achieved by producing permanent deformation of the metallic portions at the time of the forming operation while remaining within the range of elastic deformation of the plate.

It is worthy of note that the plate is maintained in the desired shape by the copper portions when the forming operation has been completed.

This composite part is fabricated for example from two copper sheets having a thickness of approximately 0.6 mm and from a sheet of epoxy resin reinforced with glass fibers and having a thickness of 0.3 mm.

The copper sheets are first subjected to a surface treatment by chemical and/or mechanical process in order to roughen one of the surfaces of each sheet and the sheet of epoxy resin is subjected to a prepolymerization treatment.

The sheet of epoxy resin is then placed between the two copper sheets by putting that surface of each copper sheet which has been subjected to the roughening threatment in contact with the sheet of epoxy resin, whereupon the copper sheets are bonded to the sheet of epoxy resin in the hot state and under pressure. By way of example, this operation can be carried out by means of a heating press at a temperature of 180° C. and under a pressure of 11 kg/cm$^2$, the assembly formed by the three sheets being placed between two stainless steel plates of the press. Cooling of the assembly is then carried out while maintaining the pressure. There is thus obtained a laminate constituted by the two copper sheets between which is interposed the sheet of epoxy resin reinforced with glass fibers.

Raised metallic portions are then formed by conventional methods such as photoetching, for example, on the laminate which has just been obtained.

In order to form the raised metallic portions by photoetching, a photopolymerizable resin is deposited on the two copper sheets and then subjected to irradiation with ultraviolet rays, for example, in accordance with the pattern outline to be obtained in order to polymerize and harden the resin in the desired locations and thus to protect the copper sheet. The assembly thus obtained is then subjected to the action of specific chemical reagents which are selected first of all with a view to dissolving the non-polymerized resin and then with a view to removing the copper sheet in those zones of this latter which are not protected by the polymerized and hardened resin, whereupon the film of polymerized and hardened resin is finally dissolved.

The product obtained is constituted by the sheet of epoxy resin provided on each face with copper portions which form a raised pattern corresponding for example to a circuit pattern. The composite part thus obtained can then be subjected to a mechanical cold-forming operation such as folding or bending in order to give the part a predetermined shape such as, for example, a plate which is curved in the shape of a cylinder having a circular cross-section.

This mechanical cold-forming operation is carried out by means of conventional devices of the type usually employed for bending or folding copper sheets.

In the table given below, there have been grouped together by way of example the geometrical characteristics of different composite parts in accordance with the invention, in which a plate of electrically-insulating flexible material is covered on each face with metallic portions of copper.

In the case of each part, this table gives the nature of the electrically-insulating flexible material employed, the value $e_i$ (in mm) of the thickness of the plate of electrically-insulating flexible material and the upper limiting value $e_m$ (in mm) of the thickness of the metallic portions, thus making it possible to subject the composite part to a mechanical cold-forming operation and to obtain a curved plate having a minimum radius of curvature $r_{min}$ expressed in mm.

| Composite part | Electrically insulating flexible material | $e_i$ (mm) | $e_m$ (mm) | $r_{min}$ (mm) |
| --- | --- | --- | --- | --- |
| No 1 | epoxy resin reinforced with glass fibers | 0.3 | 0.6 | 50 |
| No 2 | KAPTON (polyimide) | 0.1 | 0.5 | 20 |
| No 3 | epoxy resin reinforced with glass fibers | 0.4 | 0.8 | 60 |
| No 4 | epoxy resin reinforced with glass fibers | 0.5 | 1 | 70 |

The advantageous property of the composite part in accordance with the invention thus lies in the possibility of giving it the desired shape by mechanical cold-forming. In consequence, the part is of considerble interest in a large number of applications, especially in the electrical field for the fabrication of printed circuits having a circular or elliptical configuration or any other shape. A further potential application is the fabrication of heat sinks for conventional circuits or superconducting circuits.

Figure 2:
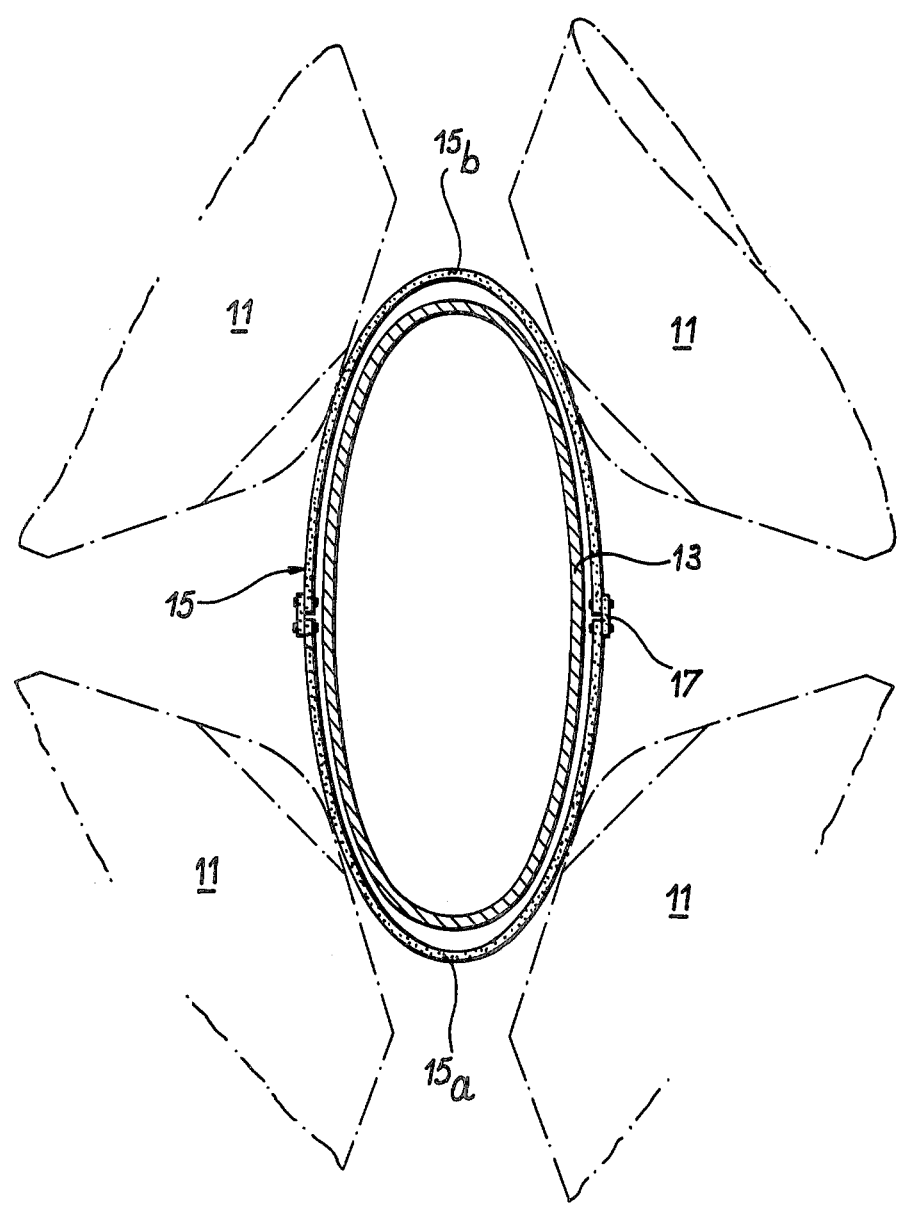
FIG. 2 illustrates a magnetic circuit placed within a quadrupole and constructed by means of a composite part in accordance with the invention.

Reference being now made to FIG. 2, there is shown one example of utilization of the composite part in accordance with the invention.

This figure shows a quadrupole 11 which is more especially intended for a particle accelerator, the particle beam being located within a elliptical chamber 13 in which a vacuum is maintained. There is also shown a magnetic circuit 15 for producing within the interior of the quadrupole 11 an additional magnetic field which serves to correct aberrations of the magnetic field produced by the quadrupole or to add a field component to a system.

The space available for mounting the magnetic circuit in position is very small since said circuit has to be inserted between the elliptical chamber 13 and the pole pieces of the quadrupole 11.

Said magnetic circuit 15 is fabricated from two composite parts shaped in the form of curved plates 15a and 15b, the curved portion of which has a very short radius of curvature of the order of 20 mm. Said plates are joined together at their ends by means of fixing screws 17 in order to form a cylinder having an elliptical cross-section. On each plate, the metallic portions of copper represent the magnetic circuit pattern and have a thickness of approximately 0.5 mm, with the result that a direct current having an intensity of the order of 10 amps and a power of the order of 300 watts can flow through said circuit.

It can be noted that, in this application, the use of a standard wire winding would be much more cumbersome and that reproducibility of the circuit pattern would be less accurate.

The composite parts in accordance with the invention can also be employed in the fabrication of lenses of the dipole, quadrupole, six-pole or eight-pole type, or any combinations of these lenses.

In this case, the composite parts in accordance with the invention are given the shape of cylinders which have a circular cross-section and can be superposed.

Thus a lens of this type does not entail the need for any supporting means over the entire length of the cylinders, thus permitting more efficient heat removal. Moreover, the number of ampere-turns in respect of a given volume is comparable with a conventional winding but the tolerances of reproducibility are guaranteed and the cost price is distinctly lower. In these lenses, the current can also be of the order of 10 amps and the power can have a value of several hundred watts. The low resistance of the lens is obtained by virtue of the thickness of copper and not by virtue of the width of the turns. In consequence, the turns can be more numerous than in a conventional winding having the same overall size.

The composite parts in accordance with the invention can also be employed in the form of thick circuits coiled in cylinders for the construction of low-inertia motor windings.

Finally, the composite parts in accordance with the invention also find other applications such as heat sinks, for example, in conventional circuits or super-conducting circuits.

In this type of application, the composite parts of the invention are interposed between the hot conductors and a connection between the metallic portions of the part and the conductors to be cooled is ensured either by means of a metallic deposit or by means of a heat-conducting adhesive.

These composite parts can comprise a series of strips and the strict superposition of parts having the same strip pattern makes it possible to form connecting ducts between two successive parts and to ensure more efficient cooling, especially in the event that the parts and the conductors are immersed in a coolant fluid.

We claim:

1. A composite part adapted for mechanical cold-formation into a predetermined shape, said part comprising a plate member formed of a flexible, electrical and/or thermal insulating material, and raised metallic portions bonded to at least one face of said plate member, the thickness of said plate member being no greater than the thickness of the metallic portions, said metallic portions having a thickness of at least 0.3 mm.

2. A composite part according to claim 1, wherein said plate member is of plastic material.

3. A composite part according to claim 2, wherein said plastic material is selected from the group comprising epoxy resins reinforced with glass fibers, polyimides and polyimides reinforced with glass fibers.

4. A composite part according to claim 1 wherein the metallic portions are formed from a metal selected from the group consisting of copper, silver and aluminum.

5. A composite part according to claim 4, wherein the metal is copper.

* * * * *